United States Patent
Gatnau Navarro et al.

(10) Patent No.: US 7,591,667 B2
(45) Date of Patent: Sep. 22, 2009

(54) NETWORK CONNECTION SENSING ASSEMBLY

(75) Inventors: Jordi Gatnau Navarro, Barcelona (ES); Francisco Chamorro Davalos, Seville (ES); Antoni Puell Olle, Barcelona (ES)

(73) Assignee: Tyco Electronics AMP Espana SA, Barcelona (ES)

( * ) Notice: Subject to any disclaimer, the term of this patent is extended or adjusted under 35 U.S.C. 154(b) by 0 days.

(21) Appl. No.: 11/885,490

(22) PCT Filed: Feb. 16, 2006

(86) PCT No.: PCT/GB2006/000535

§ 371 (c)(1),
(2), (4) Date: May 6, 2008

(87) PCT Pub. No.: WO2006/092553

PCT Pub. Date: Sep. 8, 2006

(65) Prior Publication Data

US 2009/0053923 A1 Feb. 26, 2009

(30) Foreign Application Priority Data

Mar. 4, 2005 (GB) ................. 0504522.4

(51) Int. Cl.
*H01R 3/00* (2006.01)
(52) U.S. Cl. .................. 439/489; 439/488; 361/736
(58) Field of Classification Search ........... 439/188, 439/189, 488, 489, 676; 340/568.2; 361/728, 361/730, 736
See application file for complete search history.

(56) References Cited

U.S. PATENT DOCUMENTS

| | | | |
|---|---|---|---|
| 4,756,695 | A | 7/1988 | Lane et al. |
| 4,859,201 | A | 8/1989 | Marsh |
| 4,986,779 | A | 1/1991 | Ferrill et al. |
| 4,990,094 | A | 2/1991 | Chandler et al. |
| 5,484,308 | A | 1/1996 | Gotz et al. |
| 6,522,737 | B1 | 2/2003 | Bartolutti et al. |
| 6,626,697 | B1 | 9/2003 | Martin et al. |

FOREIGN PATENT DOCUMENTS

WO   WO 2004/082078 A    9/2004

*Primary Examiner*—Khiem Nguyen
(74) *Attorney, Agent, or Firm*—Baker & Daniels LLP

(57) ABSTRACT

A connector assembly or interface cassette (300), comprising a housing (304) comprising a jack interface (314), said jack interface having a receptacle jack (370) therein, said receptacle jack being configured to receive a plug; and a sensor bezel (20) removably attachable to said jack interface, said sensor bezel comprising a cavity extending therethrough to allow passage of a plug when inserted into said receptacle jack, said sensor bezel including a circuit board proximate said jack cavity, and at least one sensor contact (340) aligned with, and configured to engage, a sensor probe associated with a plug insertable into said receptacle jack, characterised in that the bezel includes connection means (22) accessible from the front of the bezel whereby the bezel can be electrically connected to a sensing component independently of any components inside the said housing.

6 Claims, 13 Drawing Sheets

NETWORK CONNECTION SENSING ASSEMBLY

This invention relates to improvements in network connection sensing assemblies, for example those described in our WO-A-2004/082078 (the entire disclosure of which is incorporated herein by reference), which are available from Tyco Electronics under the trade mark "AMPTRAC".

BACKGROUND OF THE INVENTION

The present invention generally relates to a connector that connects electronic components in a network and, more particularly, relates to an interconnect module or cassette that connects network components to a sensor component.

In order to better operate large electronic networks, sensor systems have been developed to monitor connections between components within the network. The sensor system typically includes an interconnect module that is retained in a patch panel, or any number of other network structures, and interconnects two separate network components. The interconnect module includes receptacle jacks, such as modular jacks, at a mating face. These jacks receive patch cords that in turn are connected to a first network component. Each patch cord includes an electrical cable comprised of signal wires connected to a plug at one end. The plug is received within a corresponding receptacle jack such that the signal wires in the electrical cable are electrically connected to signal contacts extending from a rear side of the interconnect module. The signal contacts are in turn connected to a second set of signal wires that extend to a second network component. Thus, the interconnect module electrically interconnects the first and second network components.

Conventional interconnect modules are joined with separate sensor configurations that enable the network to determine when a plug is joined with a receptacle jack. FIGS. 5 and 6 illustrate a conventional interconnect module 600 in combination with a conventional sensor configuration. The sensor configuration includes a separate flexible etched circuit (FEC) 602 containing several sensor contacts 604 arranged on a strip 606. The strip 606 is glued to the face plate 608 near the receptacle jacks 610. Traces extend from each sensor contact 604 along the length of the FEC 602 across the front of the face plate 608 to a first connector 612 that extends from a side of the interconnect module 600. The first connector 612 is then connected to a second connector (not shown) that is connected to a sensor component (not shown). Alternatively, the first connector 612 may be positioned to extend from the rear side of the interconnect module 600 instead of from the front side.

Each plug includes a sensor probe connected to a sensor wire that carries signals between the sensor probe and an associated network component. When the plugs are fully inserted into the receptacle jacks the sensor probes contact and electrically engage the sensor contacts 604 on the FEC 602 to create a sensor circuit. The sensor component may then be used to monitor and record the connections of network components throughout the network. For example, if one network component is connected to the wrong server, a network shutdown or outage may occur which could be very costly. The sensor component determines where the faulty connection is located and determines how long it has existed in order that the outage may be quickly remedied. Additionally, the sensor component may be used to determine whether unauthorized parties are connected to a component within the network and thus improve network security.

However, the conventional interconnect module 600 suffers from several drawbacks. The FEC 602 is expensive and attaching the FEC 602 to the interconnect module 600 requires the use of adhesives and registration of the sensor contacts 604 proximate each receptacle jack 610. The process of installing the FEC 602 is thus time consuming and difficult, especially when the interconnect module 600 is located in a space-constrained network structure. Also, the first connector 612 is typically connected to the FEC 602 while the FEC 602 is attached to the interconnect module 600. The second connector hangs from the front side of the interconnect module 600 and is thus easily damaged during installation and use. Also, the second connector takes up a great deal of space which renders the interconnect module 600 difficult to install in space-constrained network structures. The interconnect module 600 requires cables and a second connector to connect the first connector 612 to the sensor component. The connectors and cables take up space and increase the risk of an unintentional disconnection and also limit the adaptability of the interconnect module 600 by presenting a more complicated structure of components to consider when adding or changing connections. In addition, the cables preferably should be selected at the time of installation of the FEC 602 to have a fixed length in order that loops of extra cable are not situated at the patch panel. Further, if any receptacle jack 610 needs to be removed or added, the entire FEC 602, which covers a portion of the receptacle jacks 610, has to be removed and replaced. Also, positioning the first connector 612 to extend to the rear side of the interconnect module 600 requires a difficult and expensive mechanical routing process that requires removal or modification of components already on the rear side of the interconnect module 600.

Our aforementioned WO-A-2004/082078 relates to interconnect modules that address the above problems and other concerns experienced in the prior art, and provides a connector assembly which comprises a housing comprising a jack interface. The jack interface has a receptacle jack therein, and the receptacle jack is configured to receive a plug. A sensor bezel is removably attachable to the jack interface, and the sensor bezel comprises a cavity extending therethrough to allow passage of a plug when inserted into the receptacle jack. The sensor bezel includes a circuit board proximate the jack cavity. At least one sensor contact is aligned with, and configured to engage, a sensor probe associated with a plug insertable into the receptacle jack.

Also described in WO-A-2004/082078 is an interconnect cassette configured to electrically communicate with a network component and a sensing component, and the interconnect cassette comprises a housing comprising a jack interface. The jack interface has a plurality of receptacles formed therein, and each of the plurality of receptacles is configured to receive a plug of a patch cord. A sensor bezel is removably attachable to the jack interface, and the sensor bezel is configured to engage the jack interface and have at least one cavity extending therethrough to allow passage of a plug when inserted into one of the receptacles. The sensor bezel includes a circuit board and a plurality of sensor contacts electrically connected to the circuit board. Each of the sensor contacts are aligned with, and are configured to engage, a sensor probe associated with a plug insertable into the receptacle.

Further described in WO-A-2004/082078 is a sensor bezel configured to be removably secured to a network connection component having a plurality of receptacle jacks formed therein, aligning with, and configured to engage sensor probes associated with plugs which may be inserted into one of the receptacle jacks. The sensor bezel comprises a circuit board, a bezel holding the circuit board, at least one jack cavity proximate the circuit board, a plurality of sensor contacts configured to be positioned proximate respective receptacle jacks, and an interchangeable output cassette generating a signal dependant upon the connections to the receptacle jacks.

In these known arrangements, the sensor bezel circuit board is electrically connected to components inside the housing to generate the output signal, which is conveyed to a suitable sensing component. The circuit board may include a card edge connector for convenient connection to interchangeable output cassettes as desired. The sensor contacts in an exemplary embodiment are metallic plates located between the sensor bezel and a jack interface of the network component to facilitate accurate and reliable sensing of connections.

A first aspect of the present invention provides a sensor bezel generally of the kind described hereinbefore and in WO-A-2004/082078, with the improvement comprising connection means accessible from the front of the bezel to connect it electrically to a sensing component independently of any components within the connector housing on which the bezel will be mounted in use. Since this improved sensor bezel need not be electrically connected to internal components inside the connector housing, it may advantageously be installed on existing connector housings not designed for such internal connections, which hitherto could not conveniently benefit from the AMPTRAC system for displaying and monitoring the plug connections. A suitable output cassette, for the purposes known per se from WO-A-2004/082078, may be incorporated in the bezel, for example in association with the front connection means, or may be provided separately at some point in the electrical circuit between the bezel and the sensing apparatus.

A second aspect of the present invention provides individual modular inserts which can be replacably fitted, preferably snap-fitted, to the bezel to sense and identify plugs inserted into the respective individual jacks mounted in the connection housing. The inserts preferably carry separate sensor contacts for sensing respectively different types of plugs/jacks, for example Category 5 or Category 6 plugs and jacks.

A third aspect of the present invention relates to the use of two-ended male/female or male/male screws to secure the jack panel and the sensor bezel to the connector housing. Such two-ended screws have the advantage that the male threaded shanks at one end of the screws can be substituted for the original securing screws holding a jack panel on an existing connector housing. This substitution then enables the sensor bezel to be superposed on the jack panel and secured by further male or female screws engaging the other end of the two-ended screws, that is the female threaded sockets of male/female screws or the second male shanks of male/male screws, without unscrewing the male shanks of the two-ended screws which are holding the jack panel in place. This eliminates the problem encountered when using ordinary single-ended male, that all of the existing attachment screws must be removed before the bezel can be superposed and secured on the jack panel, thus risking dislodgement and damage of the jack panel.

This aspect of the invention accordingly provides a method of mounting a sensor bezel on the front of a previously installed jack panel secured to a support by means of screws, comprising the steps of removing the existing attachment screws, replacing each removed screw with a male threaded shaft which is one end of a two-ended male/female or male/ male screw, and securing the bezel by means of male or female screws engaging the other end of the two-ended screws. The two-ended screws are preferably male/female screws having a female threaded bore accessible through the screw head, and the bezel is attached by means of male screws engaging the female threaded bore. Advantageously, one or more of the existing attachment screws is or are left in place until one or more of the other existing attachment screws is or are replaced with a two-ended screw, so that the jack panel is retained in place throughout the replacement operation.

To further illustrate the present invention, embodiments will now be described by way of non-limiting example with reference to the accompanying drawings, wherein:

DETAILED DESCRIPTION OF THE DRAWINGS

Figure 1:
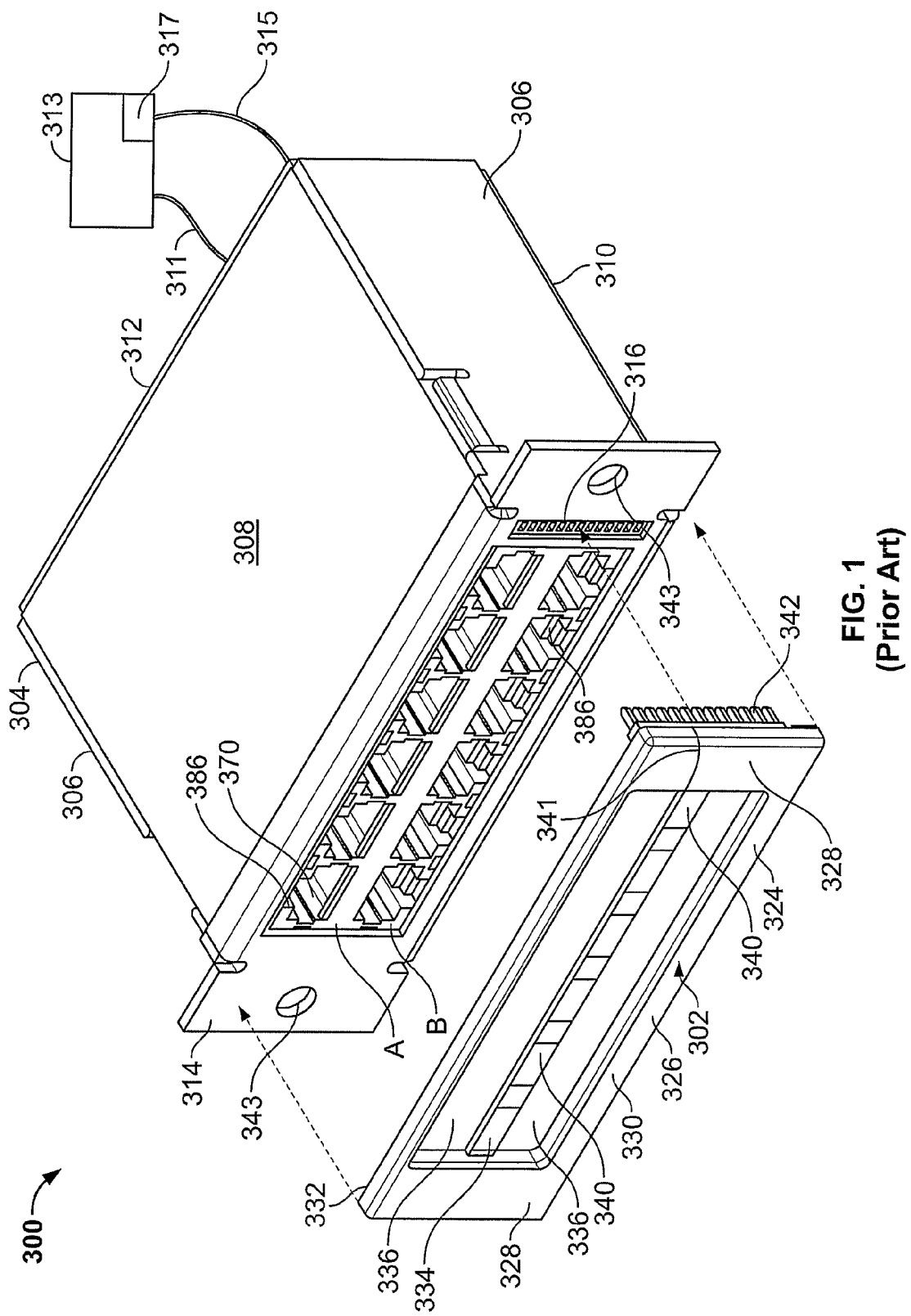
FIG. 1 illustrates a front isometric view of an interconnect cassette having two stacked rows of jack apertures configured to be mated with a sensor bezel as described in WO-A-2004/082078.

FIG. 1 illustrates a front isometric view of an interconnect cassette 300 configured to be mated with a separate and discrete sensor strip assembly 350 as described in our aforementioned WO-A-2004/082078. The interconnect cassette 300 includes a housing 304 defined by side walls 306, a top surface 308, a base 310, a rear wall 312 and a jack interface 314. The jack interface 314 includes a plurality of receptacle jacks 370 and sensor strip pin receptacles 316 positioned to the side of the receptacle jacks 370. The receptacle jacks 370 each have a channel 386 along one side thereof and are configured to receive plugs 18 (as shown in FIG. 2) on patch cords 10.

The receptacle jacks 370 are arranged in two rows (A and B) each having six receptacle jacks 370. Rows A and B of receptacles jacks 370 are stacked. Optionally, the jack interface 314 may have more or less than two rows of receptacle jacks 370. Further, more or less than six receptacle jacks 370 may be included within each row. Additionally, the sensor strip pin receptacles 316 may be positioned above or below the rows A and B of receptacle jacks 370 depending on the location of the sensor strip pins 342 on the sensor bezel 302. The interconnect cassette 300 may be connected to a network connection component such as a patch panel, a wall mounted box, a floor box, or any number of other network connection structures (not shown). Mounting features, such as fastener holes 343, are provided in the jack interface 314 to allow the interconnect cassette 300 to be mounted into a rack unit (not shown) or other such organizational and support structure. The interconnect cassette 300 connects the receptacle jacks 370 to corresponding wires, a printed circuit board, a flexible circuit, a lead frame, or the like within the housing of the interconnect cassette 300 as opposed to directly connecting each receptacle jack 370 to a corresponding structure within another network connection. The wires electrically connected to the receptacle jacks 370 may be bundled inside the interconnect cassette 300 and electrically connected to a signal input/output (I/O) interface (as described with respect to FIGS. 3 and 4 of WO-A-082078). The signal I/O interface 320 may then be connected to a cable or other connection route (such as cable 311), which in turn is electrically connected to a network component or connection 313, such as a patch panel. Because the wires from the receptacle jacks 370 are bundled within the interconnect cassette 300 and subsequently routed to corresponding features in the signal I/O interface within the interconnect cassette 300, there is no need to route numerous cables and wires from the interconnect cassette 300 to the network component 313. Rather, a single cable, such as cable 311, may house a plurality of wires and connect the interconnect cassette 300 to the network connection 313.

As illustrated in FIG. 1, the sensor bezel 302 includes a frame 324 defined by horizontal frame members 326 formed integrally with vertical frame members 328. The frame 324 includes a front face 330, a cassette interface surface 332 and a column of strip pins 342 located on one of the vertical frame members 328. Portions of the cassette interface surface 332 (for example, the edges of the cassette interface surface 332) may be bevelled, notched or ribbed such that the cassette interface surface 332 engages corresponding structures in the jack interface 314 to allow the sensor bezel 302 to be snapably, latchably, removably, or otherwise securely retained by the jack interface 314 of the interconnect cassette 300.

Optionally, the sensor bezel 302 may be securely retained by the interconnect cassette 300 without the use of glue or other such adhesives.

The strip pins 342 extend outwardly from the cassette interface surface 332 and may optionally be formed on one of the horizontal frame members 326 (as a row) or on the other vertical frame member 328. Also, optionally, strip pins 342 may be positioned on more than one of the vertical and horizontal frame member 328 and 326 (so long as they correspond to strip pin receptacles formed within the interconnect cassette 300). A sensor strip 334, attached to each vertical frame member, spans longitudinally across the sensor bezel 302 in a parallel relationship with the horizontal frame members 326. The sensor bezel 302 may be moulded with, stamped onto, or otherwise integrally formed with the frame 324. Alternatively, the horizontal frame members 328 may include slots configured to receive and retain support tabs formed as terminal ends of the sensor strip. That is, the sensor strip 334 may be removable from the frame 324. Two open jack cavities 336 are defined between the horizontal frame members 326 and the sensor strip 334 and are configured to allow plugs of patch cords (not shown) to mate with the receptacle jacks 370 as described below.

As shown in FIG. 1, the sensor strip 334 is a flexible circuit having conducting pads or sensor contacts 340, as commonly used as a connection sensor with interconnect modules. The sensor contacts 340 are electrically connected to corresponding strip pins 342 extending outwardly from the cassette interface surface 332. The sensor contacts 340 may be electrically connected to the corresponding strip pins through traces (an exemplary trace, which is under the surface of the sensor strip 334 and vertical member 328, is shown by line 341) that may be formed within or on the sensor strip 334 and the frame 324.

The sensor bezel 302 is received and retained by the interconnect cassette 300. The interconnect cassette 300 includes features that allow the strip assembly 350 to snapably, latchably or otherwise securely mount to the jack interface 314 of the interconnect cassette 300. The sensor bezel 302 is mounted to the interconnect cassette 300 without the use of glue or other such adhesives. The sensor bezel 302 may be quickly and efficiently mounted to (and removed from) the interconnect cassette 300 through snapable, latchable or other such mateable engagement between the jack interface 314 and the cassette interface surface 332. Also, the strip pins 342 may be securely retained by the strip pin receptacles 316 so that the strip assembly 350 is securely positioned on the jack interface 314 of the interconnect cassette 300. As the sensor bezel 302 is mounted to the jack interface 314 in the direction of the dashed lines, the strip pins 342 are received and retained by the strip pin receptacles 316. The strip pins 342 are then electrically connected to contacts (not shown) within the strip pin receptacles 316, which are in turn electrically connected to a sensor input/output (I/O) interface or insulated displacement contact (DC) assembly (as discussed in WO-A-082078) through internal traces, wires, or the like. The sensor I/O interface or DC assembly may then be in electrical communication with a sensing component 317 within or discrete from the network component 313 through a cable 315 or other such electrical path.

When the sensor bezel 302 is securely mounted to, and consequently in operative connection with, the interconnect cassette 300, the receptacle jacks 370 may receive the plugs of patch cords such that flexible prongs of the plugs (known per se) retain the plugs within the receptacle jacks 370. When the plugs are fully received in the receptacle jacks 370, probe heads carried by the plugs contact and electrically engage corresponding sensor contacts 340 as described in WO-A-082078. When the plugs are inserted into corresponding receptacle jacks 370, the sensor probes align with and engage corresponding sensor contacts 340 on the sensor strip 334, thereby enabling sensor signals to pass in either direction between the plug and the interconnect cassette 300.

Optionally, instead of a pin and socket configuration, the sensor bezel 302 may be compressibly connected to the interconnect cassette 300. For example, instead of the pins 342 and the receptacles 316, the sensor bezel 302 may include an array of insulators and conductors. The insulators may be longer or higher than the conductors. When the array is sandwiched between the sensor bezel 302 and interconnect cassette 300, however, the insulators may be compressed to the length or height of the conductors.

When the sensor strip 334 is operatively connected to the interconnect cassette 300, a sensor probe on the plug of a patch cord contacts the sensor strip 334 if the plug is fully mated into a corresponding receptacle jack 370. Upon full mating of the plug into the receptacle jack 370, an electrical circuit is formed between the plug and the sensor contact 340 by virtue of the sensor probe contacting the sensor contact 340. The sensing component 317 detects this electrical circuit as a connection between the plug and its corresponding receptacle jack 370. If, however, the plug becomes dislodged from its corresponding receptacle jack 370, the sensor probe no longer contacts the sensor contact 340. Thus, the electrical circuit is broken and the sensing component 317 senses that a connection is not present between the plug and its corresponding receptacle jack 370. The information regarding connections is relayed to a processing unit (not shown), which in turn may display connection information to an operator or overseer.

Reference may be made to other features described elsewhere in WO-A-2004/082078, which are omitted for brevity from the present description of the aforementioned aspects of the present invention. It is to be understood that the present invention is not necessarily limited to the specific forms of connection apparatus described in WO-A-2004/082078.

Figure 2A:
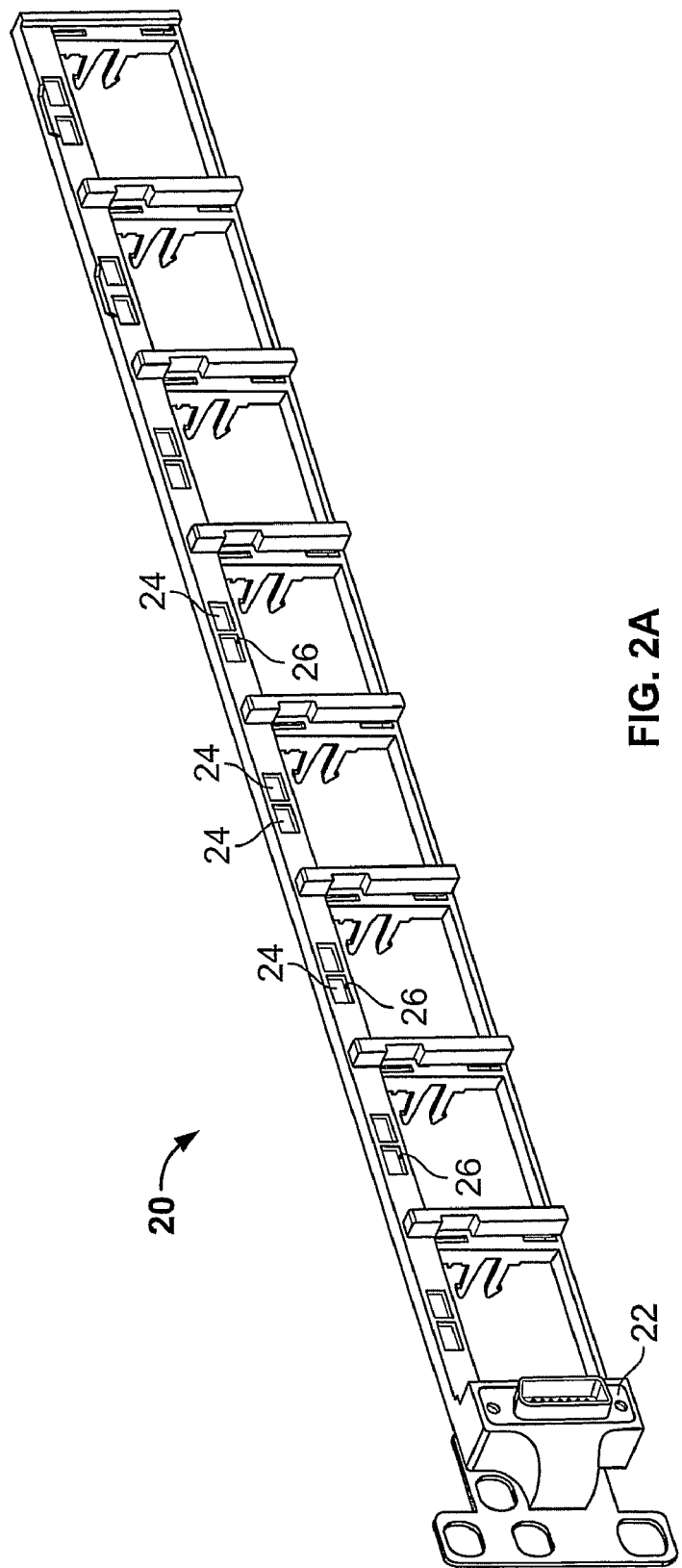
FIGS. 2A and 2B illustrate in assembled and exploded form a single-row bezel according to the first aspect of this invention having front-accessible connection means.
Figure 2B:
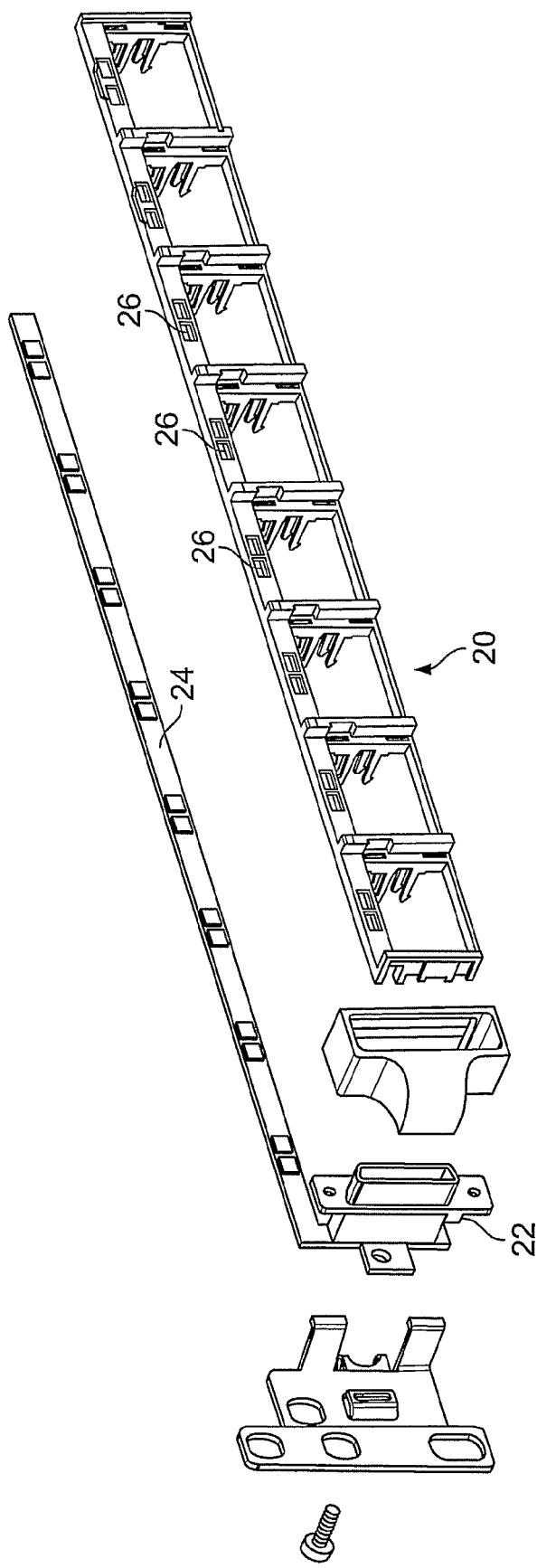

FIGS. 2A and 2B illustrate in assembled and exploded form a single-row bezel 20 according to the first aspect of this invention having front-accessible connection means 22. FIG. 2B shows the sensor strip 24, which becomes visible through apertures 26 in the assembled bezel as shown in FIG. 2A.

Figure 3:
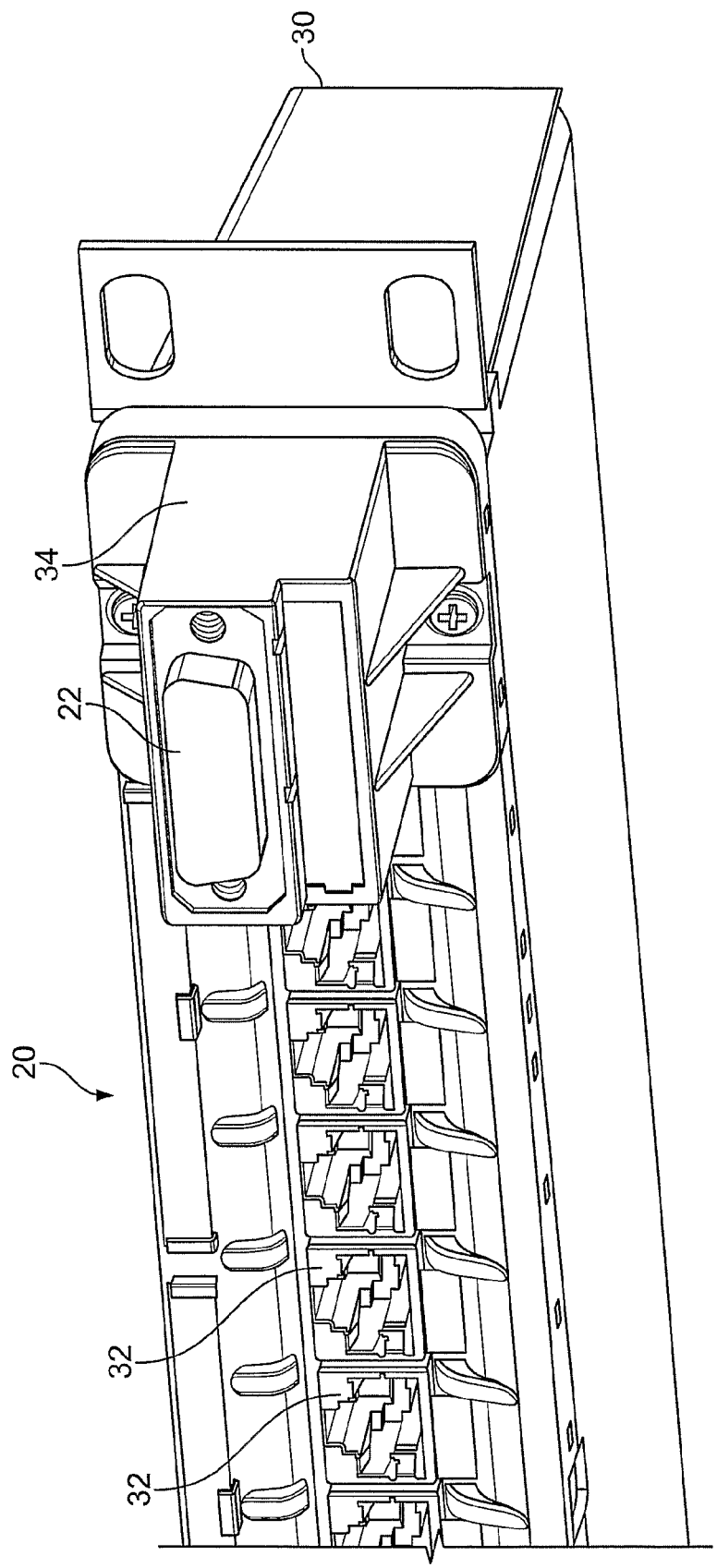
FIG. 3 illustrates a single-row bezel similar to that of FIG. 2 secured to an interconnect cassette having a single row of jack apertures, the bezel incorporating an output cassette in the front connection means.

FIG. 3 illustrates a single-row bezel 20 similar to that of FIG. 2 secured to an interconnect cassette 30 having a single row of jack apertures 32, the bezel incorporating a housing 34 containing the front connection means 22 together with an output cassette for producing the sensing signals as described in WO-A-2004/082078.

Figure 4A:
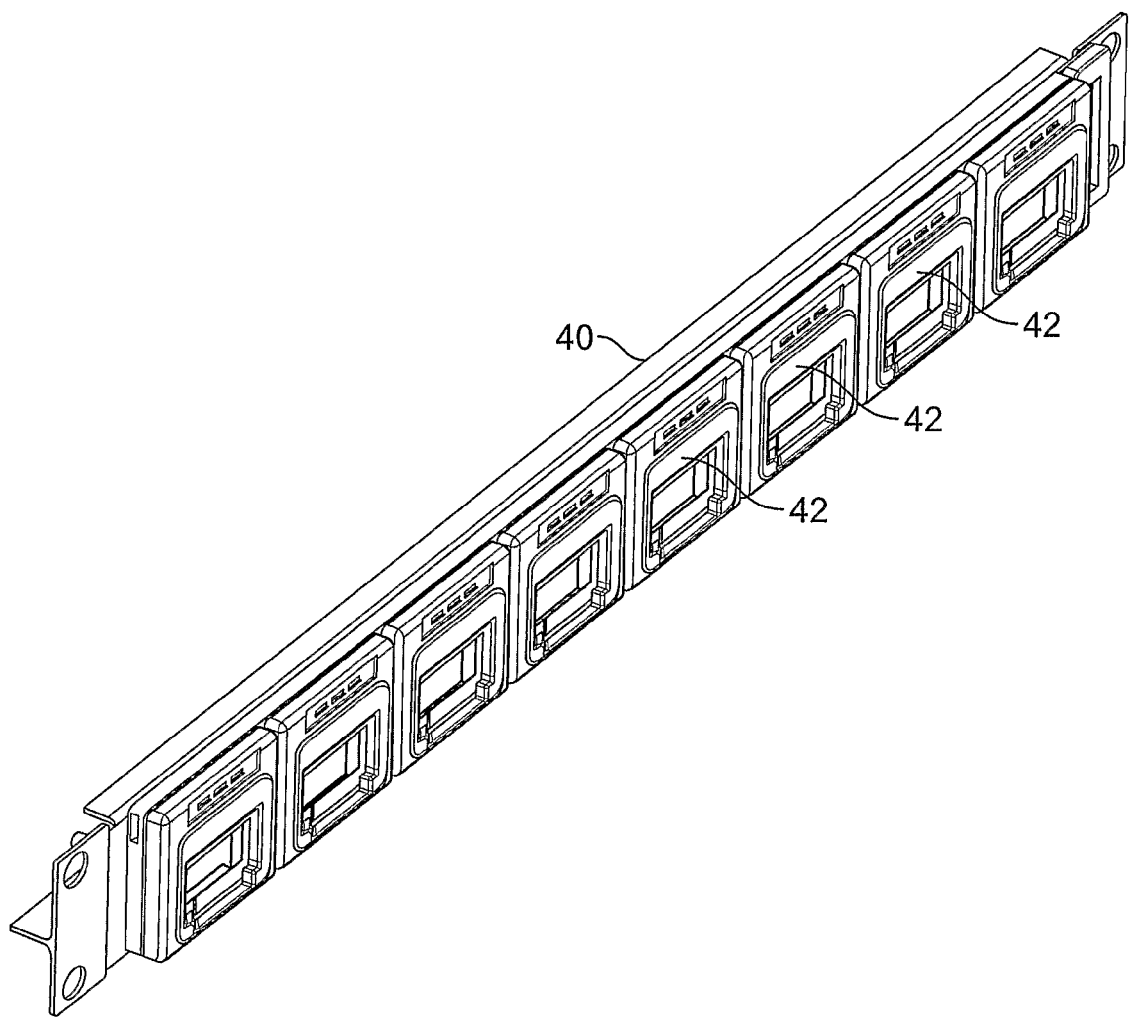
FIGS. 4A and 4B illustrate a single-row bezel having replaceable modular inserts according to the second aspect of the present invention, FIG. 4B showing one of the inserts removed from the bezel.
Figure 4B:
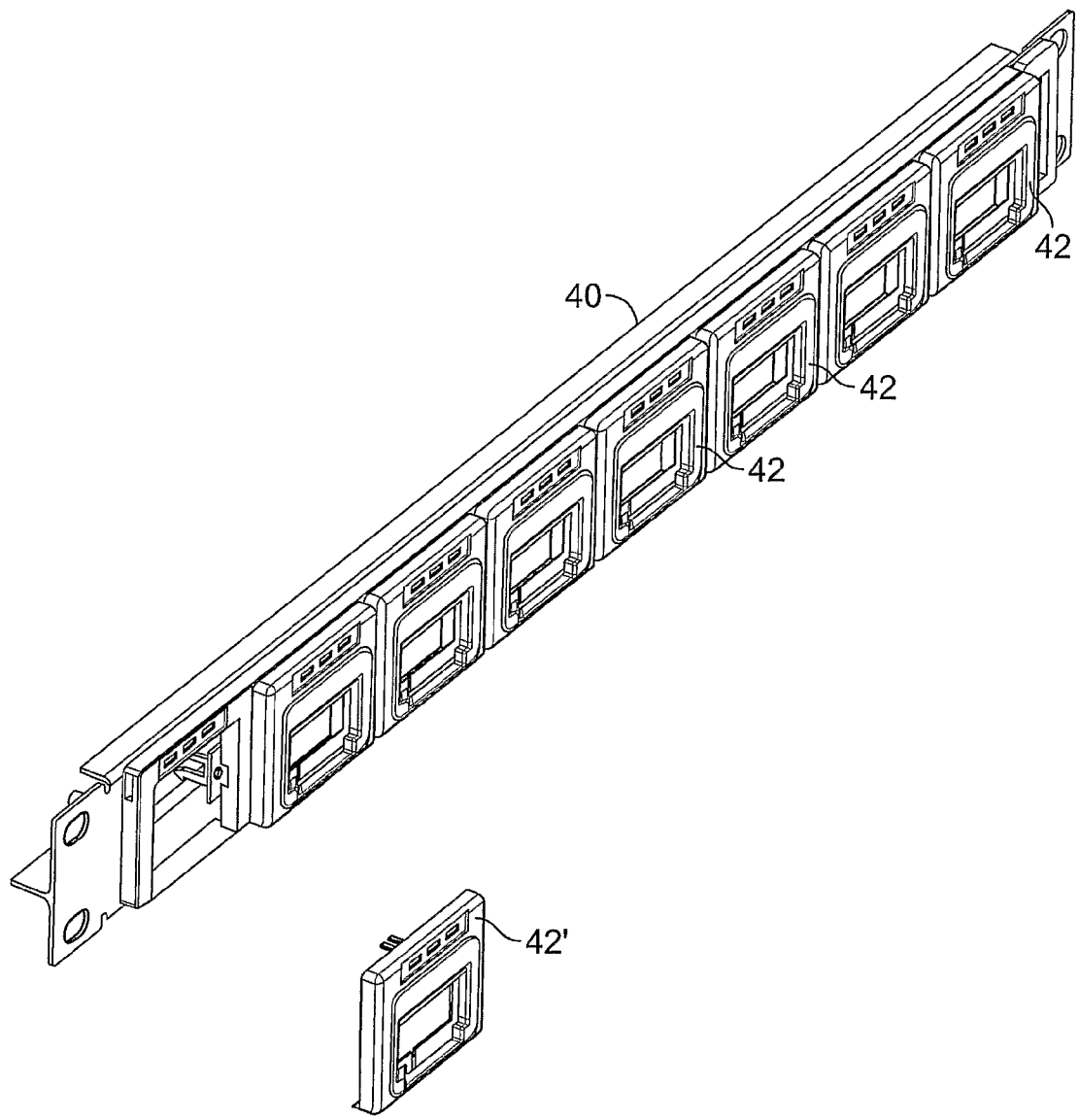
Figure 5:
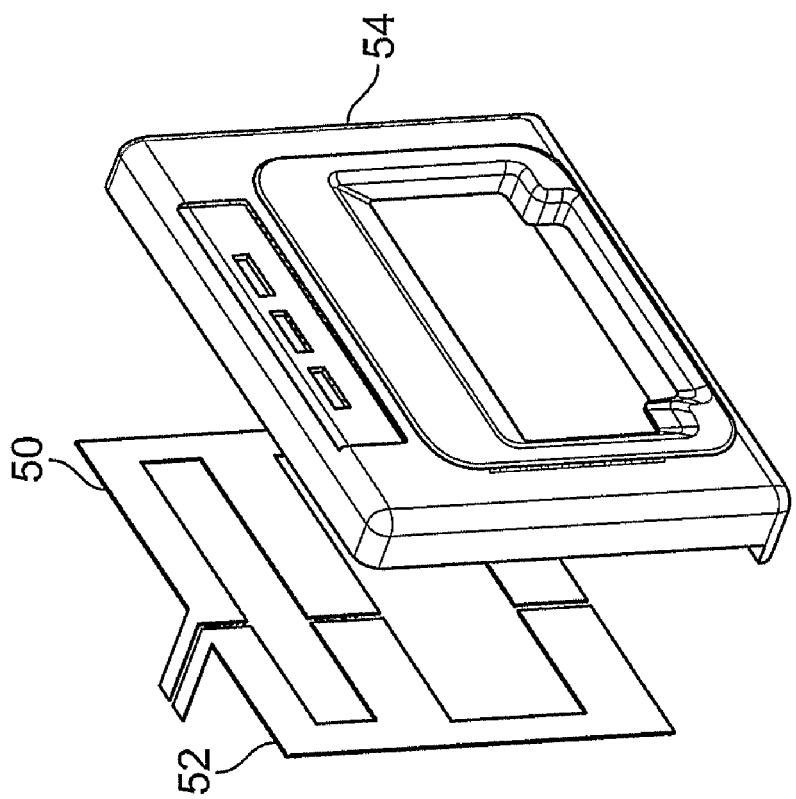
FIG. 5 illustrates in more detail the assembled and exploded structure of one of the inserts of FIG. 4.
Figure 5:
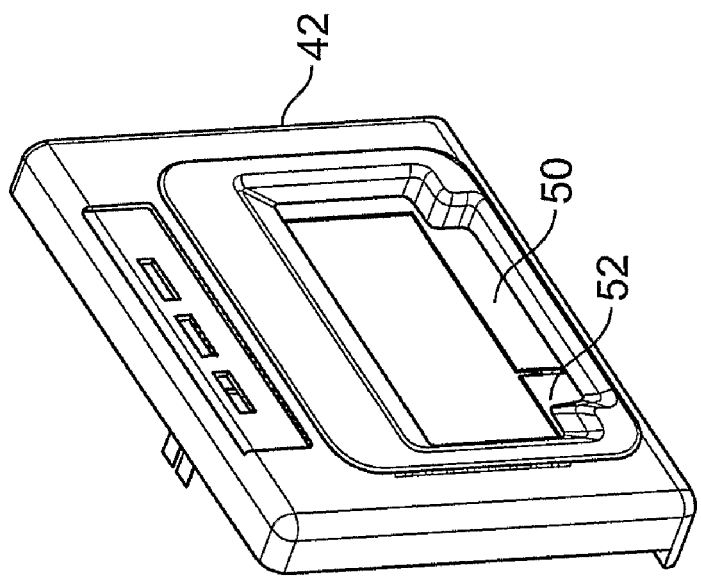

FIGS. 4A, 4B, and 5 illustrate a single-row bezel 40 having replaceable modular inserts 42 according to the second aspect of the present invention, FIG. 4B showing one of the inserts 42' removed from the bezel and FIG. 5 illustrating in more detail the assembled and exploded structure of one of the inserts of FIG. 4. The exploded view in FIG. 5 shows the split electrode structure 50, 52 separated from the casing 54 of an insert 42.

Figure 6:
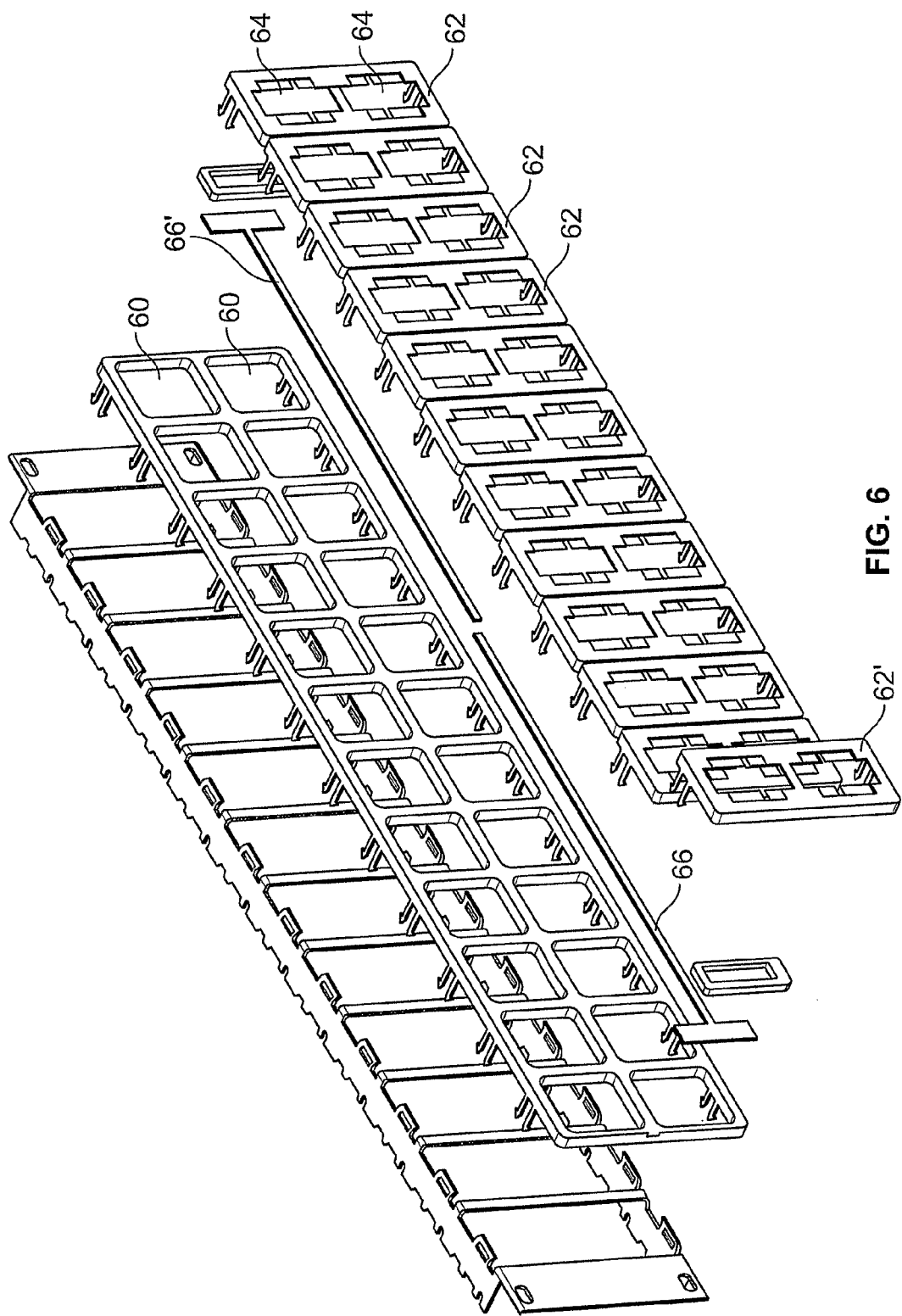
FIG. 6 illustrates in exploded form a sensor bezel having 24 apertures arranged in two stacked rows of 12, with a replaceable modular insert having two stacked apertures aligned for attachment to each stacked pair of bezel apertures.

FIG. 6 illustrates in exploded form a sensor bezel having 24 apertures 60 arranged in two stacked rows 12, with replaceable modular inserts 62 similar to those of FIGS. 4 and 5, but each having two stacked apertures 64 aligned for attachment to each stacked pair of bezel apertures 60. One insert 62' is shown separated from the others. Sensor strips 66 and 66' are each arranged to co-operate with a sub-set of six of the stacked inserts.

Figure 7:
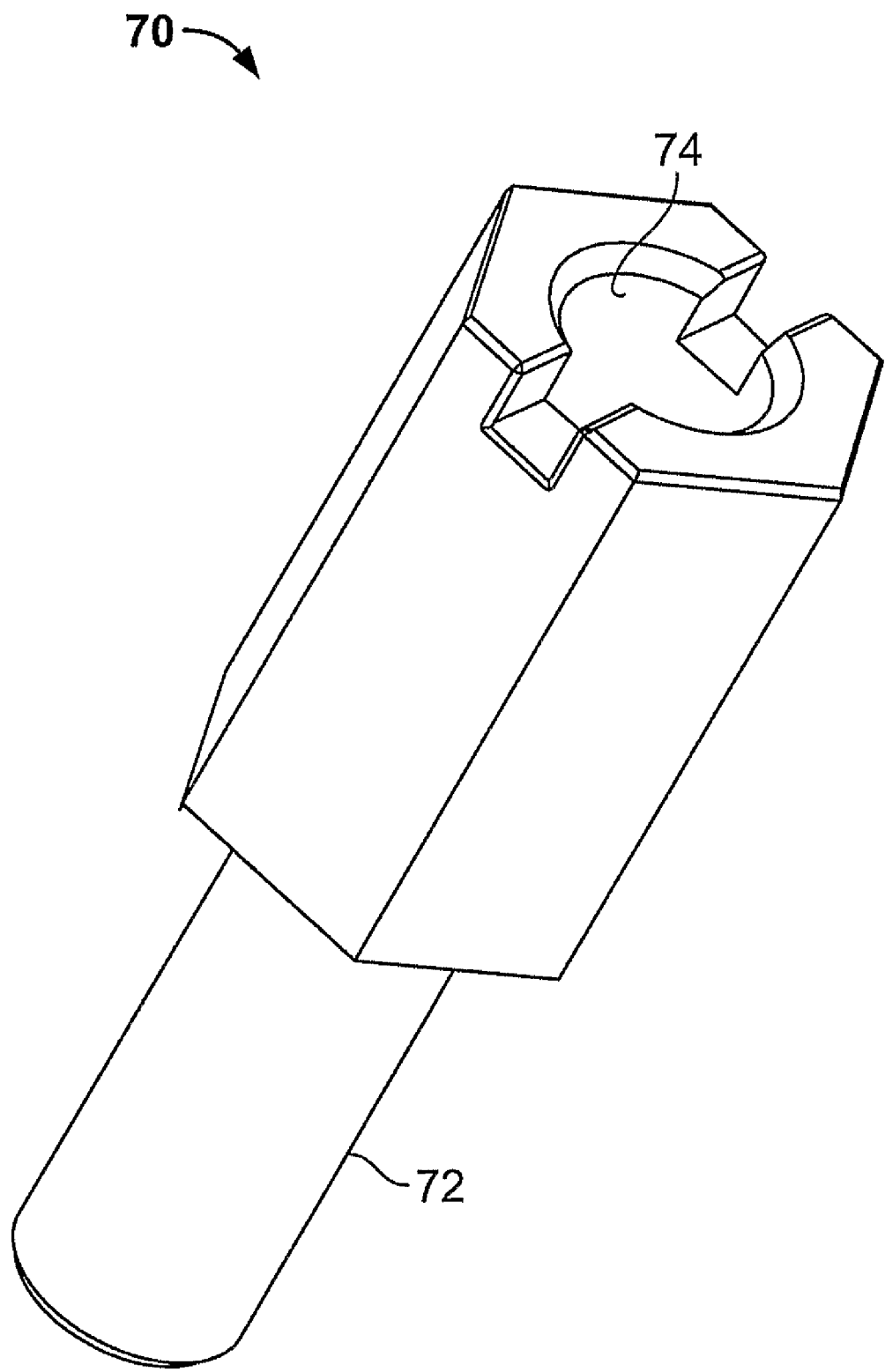
FIG. 7 illustrates a male-female screw suitable for use according to the third aspect of the present invention.

FIG. 7 illustrates a male-female screw 70 suitable for use according to the third aspect of the present invention. The illustrated screw has a male threaded shank 72 with a hexagonal head containing a female threaded bore 74, the structure of the head being variable as desired in practice.

Figure 8A:
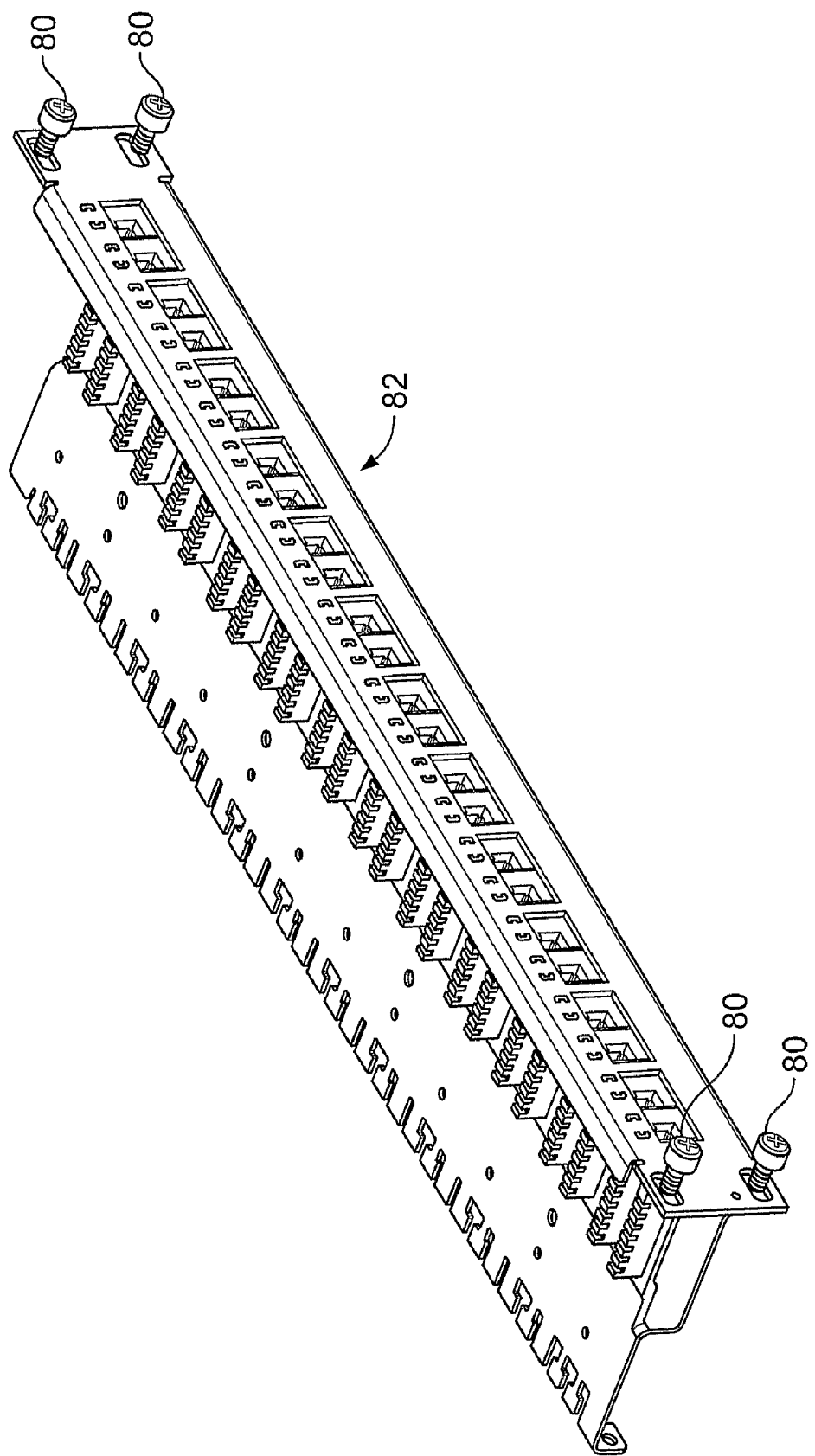
FIGS. 8A and 8B illustrate respectively the removal (preferably one-at-a-time) of male securing screws from a jack panel and their replacement with male/female screws such as those shown in FIG. 7.
Figure 8B:
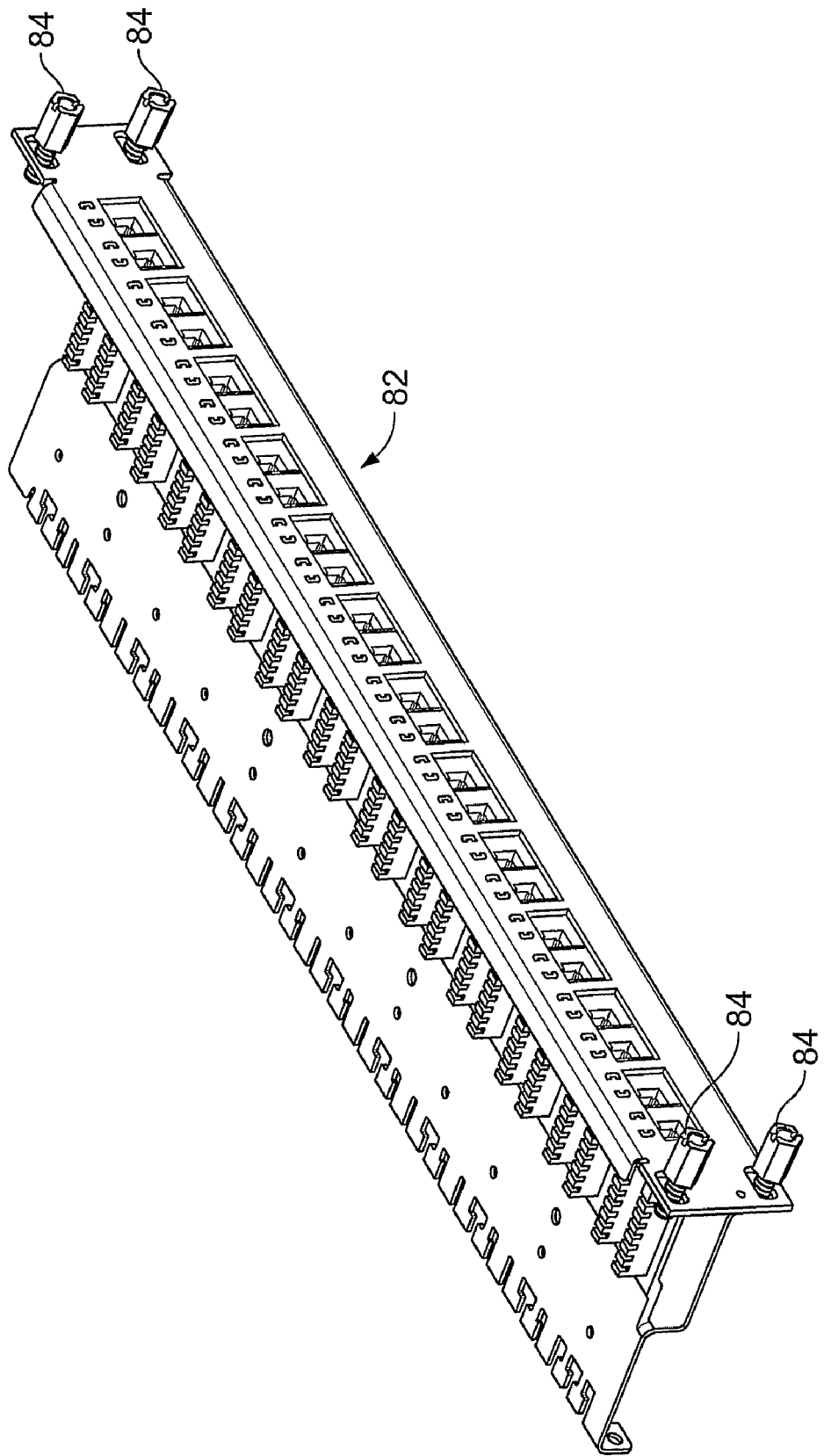

FIG. 8A illustrates, according to the third aspect of this invention, the removal (one-at-a-time in practice) of existing male securing screws 80 from a single-row jack panel 82 already installed on a connector cassette or other support (not shown); and FIG. 8B illustrates the replacement (one-at-a-time in practice) of the male screws with the threaded male shank of male/female screws 84 similar to those shown in FIG. 7. The substitution of the screws does not require detachment of the jack panel 82 from the cassette or other support.

Figure 9A:
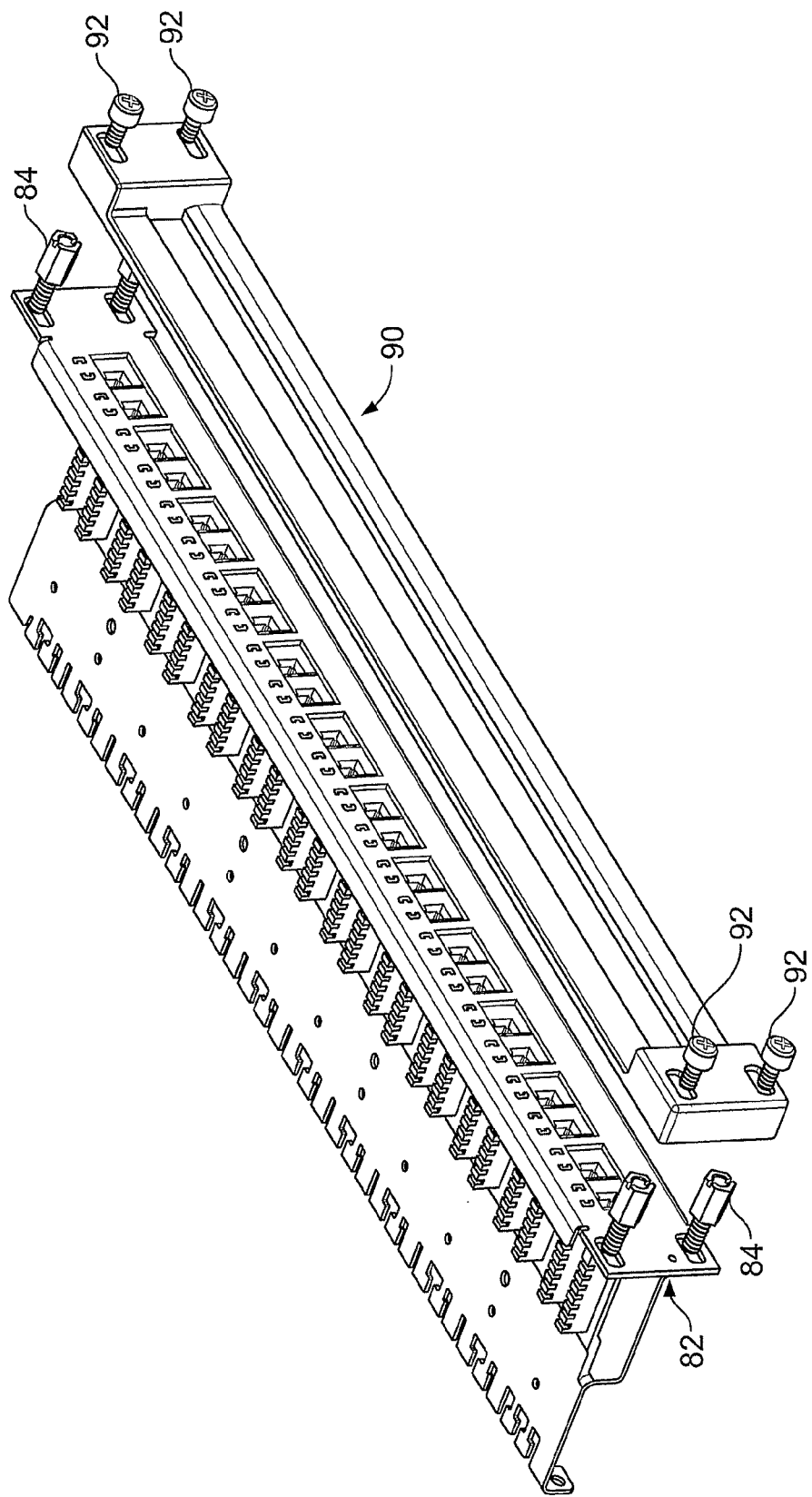
FIGS. 9A and 9B show a single-row jack panel and sensor bezel with male screws respectively aligned to engage, and subsequently engaging, the female threaded sockets of the male/female screws installed as shown in FIG. 8, thereby to secure the bezel to the front of the jack panel.
Figure 9B:
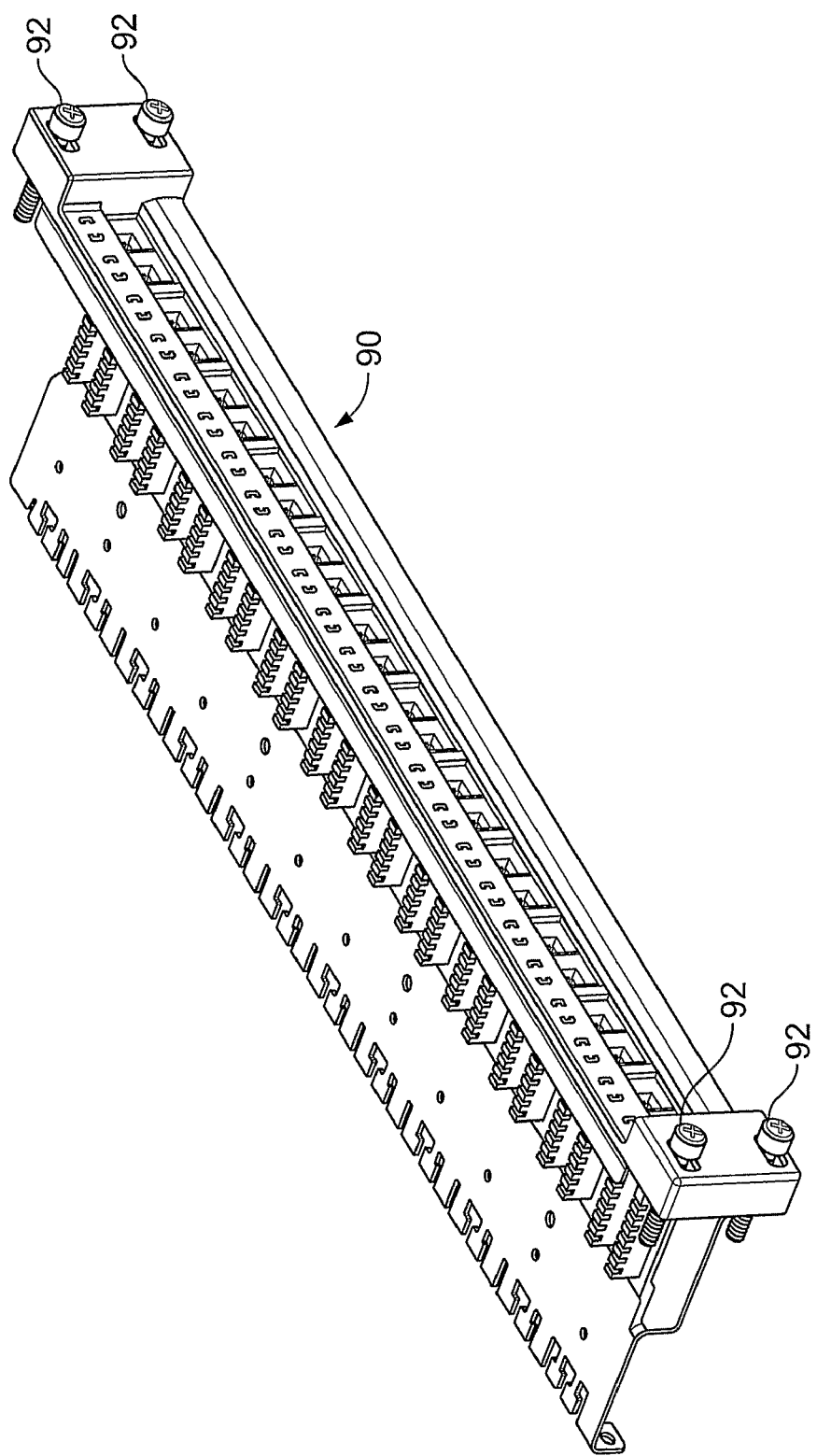

FIG. 9A shows the single-row jack panel 82 of FIG. 8B with the male/female screws 84 in place, and a sensor bezel 90 with male screws 92 aligned ready to engage the female threaded bores of the male/female screws 84 in order to secure the bezel 90 to the front of the jack panel 82. FIG. 9B shows the bezel 90 thus secured to the jack panel by the male screws 92 tightened in the threaded bores of the male/female screws (now hidden behind the bezel).

While the invention has been described in terms of various specific embodiments, those skilled in the art will recognize that the invention can be practiced with modification within the spirit and scope of the claims.

What is claimed is:

1. A connector assembly or interface cassette, comprising a housing comprising a jack interface, said jack interface having a receptacle jack therein, said receptacle jack being configured to receive a plug; and a sensor bezel removably attachable to said jack interface, said sensor bezel comprising a cavity extending therethrough to allow passage of a plug when inserted into said receptacle jack, said sensor bezel including a circuit board proximate said jack cavity, and at least one sensor contact aligned with, and configured to engage, a sensor probe associated with a plug insertable into said receptacle jack, the bezel including connection means accessible from the front of the bezel whereby the bezel can be electrically connected to a sensing component independently of any components inside the said housing.

2. The connector assembly or cassette of claim 1, further comprising an output cassette carried by the bezel, said output cassette configured to generate an output signal for transmission to the said sensing component through the said connection means.

3. The connector assembly or cassette of claim 2, wherein the output cassette is arranged to be interchangeable.

4. A sensor bezel, comprising:
    a housing comprising a jack interface, said jack interface having a receptacle jack therein, said receptacle jack being configured to receive a plug;
    a sensor bezel removably attachable to said jack interface, said sensor bezel comprising a cavity extending therethrough to allow passage of a plug when inserted into said receptacle jack, said sensor bezel including a circuit board proximate said jack cavity, and at least one sensor contact aligned with, and configured to engage, a sensor probe associated with a plug insertable into said receptacle jack, the bezel including connection means accessible from the front of the bezel whereby the bezel can be electrically connected to a sensing component independently of any components inside the said housing; and
    individual modular inserts which can be replacably fitted, to the bezel to sense and identify plugs inserted into the respective individual jacks mounted in the connection housing.

5. A bezel according to claim 4, wherein the inserts carry separate sensor contacts for sensing respectively Category 5 or Category 6 plugs and jacks, or other different types of plugs/jacks or male/female connectors.

6. A bezel according to claim 4, further comprising an individual modular insert which can be fitted to a bezel.

* * * * *